(12) United States Patent
Goel et al.

(10) Patent No.: US 10,573,717 B2
(45) Date of Patent: *Feb. 25, 2020

(54) SELECTIVE EPITAXIALLY GROWN III-V MATERIALS BASED DEVICES

(71) Applicant: Intel Corporation, Santa Clara, CA (US)

(72) Inventors: Niti Goel, Portland, OR (US); Gilbert Dewey, Hillsboro, OR (US); Niloy Mukherjee, Portland, OR (US); Matthew V. Metz, Portland, OR (US); Marko Radosavljevic, Beaverton, OR (US); Benjamin Chu-Kung, Portland, OR (US); Jack T. Kavalieros, Portland, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/198,725

(22) Filed: Nov. 21, 2018

(65) Prior Publication Data

US 2019/0088747 A1 Mar. 21, 2019

Related U.S. Application Data

(63) Continuation of application No. 15/464,888, filed on Mar. 21, 2017, now Pat. No. 10,181,518, which is a
(Continued)

(51) Int. Cl.
*H01L 21/02* (2006.01)
*H01L 29/205* (2006.01)
(Continued)

(52) U.S. Cl.
CPC ........ *H01L 29/205* (2013.01); *H01L 21/0262* (2013.01); *H01L 21/02381* (2013.01);
(Continued)

(58) Field of Classification Search
CPC ... H01L 29/0607; H01L 29/20; H01L 29/205; H01L 29/66469; H01L 29/66522; H01L 29/66795; H01L 29/785
(Continued)

(56) References Cited

U.S. PATENT DOCUMENTS

| 5,399,522 A | 3/1995 | Ohori |
| 10,181,518 B2 * | 1/2019 | Goel ................. H01L 29/66795 |

(Continued)

FOREIGN PATENT DOCUMENTS

| CN | 101814457 | 8/2010 |
| CN | 102656699 | 9/2012 |

(Continued)

OTHER PUBLICATIONS

Office Action from Great Britain Patent Application No. 1817284.1, dated Nov. 12, 2018, 5 pages.
(Continued)

*Primary Examiner* — Long K Tran
(74) *Attorney, Agent, or Firm* — Schwabe, Williamson & Wyatt, P.C.

(57) ABSTRACT

A first III-V material based buffer layer is deposited on a silicon substrate. A second III-V material based buffer layer is deposited onto the first III-V material based buffer layer. A III-V material based device channel layer is deposited on the second III-V material based buffer layer.

20 Claims, 8 Drawing Sheets

Related U.S. Application Data continuation of application No. 14/778,574, filed as application No. PCT/US2013/048743 on Jun. 28, 2013, now Pat. No. 9,640,622.

(51) Int. Cl.
  *H01L 29/06* (2006.01)
  *H01L 29/66* (2006.01)
  *H01L 29/78* (2006.01)
  *H01L 29/20* (2006.01)

(52) U.S. Cl.
  CPC .. *H01L 21/02463* (2013.01); *H01L 21/02466* (2013.01); *H01L 21/02502* (2013.01); *H01L 21/02538* (2013.01); *H01L 21/02546* (2013.01); *H01L 21/02549* (2013.01); *H01L 29/0607* (2013.01); *H01L 29/20* (2013.01); *H01L 29/66522* (2013.01); *H01L 29/66795* (2013.01); *H01L 29/785* (2013.01); *H01L 29/66469* (2013.01)

(58) Field of Classification Search
  USPC ............................ 257/189, 190; 438/48, 156
  See application file for complete search history.

(56) References Cited

U.S. PATENT DOCUMENTS

| | | |
|---|---|---|
| 2001/0008299 A1 | 7/2001 | Linthicum et al. |
| 2001/0042503 A1 | 11/2001 | Lo et al. |
| 2003/0183896 A1 | 10/2003 | Nagata |
| 2005/0242395 A1 | 11/2005 | Chen et al. |
| 2009/0242873 A1 | 10/2009 | Pillarisetty et al. |
| 2009/0267196 A1 | 10/2009 | Dyer et al. |
| 2010/0032791 A1 | 2/2010 | Hiroki et al. |
| 2010/0117094 A1 | 5/2010 | Nishikawa et al. |
| 2010/0263707 A1 | 10/2010 | Cheong et al. |
| 2011/0013657 A1 | 1/2011 | Sumitomo et al. |
| 2011/0101421 A1 | 5/2011 | Xu et al. |
| 2011/0147711 A1 | 6/2011 | Pillarisetty et al. |
| 2012/0142166 A1 | 6/2012 | Hudait et al. |
| 2012/0223328 A1 | 9/2012 | Ikuta et al. |
| 2012/0292665 A1 | 11/2012 | Alessio et al. |
| 2013/0020581 A1 | 1/2013 | Teraguchi et al. |
| 2014/0291737 A1* | 10/2014 | Hafez .................. H01L 29/785 257/288 |

FOREIGN PATENT DOCUMENTS

| | | |
|---|---|---|
| CN | 103065973 | 4/2013 |
| EP | 0329400 | 8/1989 |
| EP | 2426699 | 3/2012 |
| JP | 2003289152 | 10/2003 |
| JP | 2010040973 | 2/2010 |
| RU | 100336 U1 | 12/2010 |
| TW | 200409203 | 6/2004 |
| WO | WO 2014051779 | 4/2014 |

OTHER PUBLICATIONS

Notice of Allowance for Taiwan Patent Application No. 105113099, dated Oct. 2, 2018, 3 pages.
Office Action for Chinese Patent Application No. 201380076968.6 dated Sep. 29, 2017, 7 pages.
Office Action for Chinese Patent Application No. 201380076968.6 dated Jun. 14, 2018, 10 pages.
Office Action for Great Britain Patent Application No. 1520312.8 dated May 2, 2018, 2 pages.
Office Action for Great Britain Patent Application No. 1520312.8 dated Dec. 15, 2017, 5 pages.
Office Action from Russian Patent Application No. 2015151123 dated May 31, 2017, 9 pages.
Notice of Allowance from Russian Patent Application No. 2015151123 dated Sep. 25, 2017, 8 pages.
Office Action from Taiwan Patent Application No. 105113099 dated Apr. 11, 2018, 6 pages.
Office Action from U.S. Appl. No. 14/778,574 dated Aug. 22, 2016, 9 pages.
International Search Report and Written Opinion for PCT Patent Application No. PCT/US2013/048743 dated Mar. 31, 2014, 10 pgs.
International Preliminary Report on Patentability for PCT Patent Application No. PCT/US2013/048743 dated Jan. 7, 2016, 12 pgs.
Office Action for Taiwan Patent Application No. 103121216 dated Aug. 25, 2015, 14 pages, with English translation.
Notice of Allowance for Taiwan Patent Application No. 103121216 dated Mar. 24, 2016, 4 pages, with English translation of claims only.
Office Action for Great Britain Patent Application No. 1817284.1, dated Nov. 29, 2018, 5 pgs.
Notice of Allowance for Great Britain Patent Application No. 1520312.8, dated Dec. 15, 2018 2 pgs.
Notice of Allowance for Great Britain Patent Application No. 1817284.1, dated Feb. 12, 2019 2 pgs.
Office Action for Chinese Application No. 201380076968.6, dated Nov. 29, 2018, 9pgs.
Office Action for Korean Application No. 10-2015-7032315, dated Jul. 26, 2019, 8pgs.

* cited by examiner

SELECTIVE EPITAXIALLY GROWN III-V MATERIALS BASED DEVICES

This application is a continuation of U.S. application Ser. No. 15/464,888 filed on Mar. 21, 2017, which is a continuation of U.S. application Ser. No. 14/778,574 filed on Sep. 18, 2015, now U.S. Pat. No. 9,640,622 issued May 2, 2017, which claims the benefit of U.S. National Phase Application under 35 U.S.C. § 371 of International Application No. PCT/US2013/048743, filed Jun. 28, 2013, entitled "Selective Epitaxially Grown III-V Materials Based Devices", which is incorporated by reference in its entirety.

TECHNICAL FIELD

Embodiments as described herein relate to the field of electronic device manufacturing, and in particular, to manufacturing of III-V materials based devices.

BACKGROUND ART

Typically, defects are generated when novel materials, for example III-V materials are grown on a silicon ("Si") substrate due to lattice mismatch. These defects can reduce the mobility of carriers (e.g., electrons, holes, or both) in the III-V materials.

Due to the defects generation, integration of the III-V material based devices, germanium based devices, or other lattice mismatched materials based devices onto a silicon substrate for Complementary Metal-Oxide Semiconductor ("CMOS") systems is a big challenge.

Currently, a selective area epitaxy is used to form III-V MOS devices on a silicon substrate. Generally, selective area epitaxy is referred to the local growth of an epitaxial layer through a patterned dielectric mask deposited on a semiconductor substrate. Due to lattice mismatch, the defects are generated when the III-V based devices are locally grown on a patterned silicon substrate. Currently there is no state of art solution to integrate n-type and p-type III-V materials based MOS devices on to a silicon substrate.

DESCRIPTION OF THE EMBODIMENTS

Figure 1:
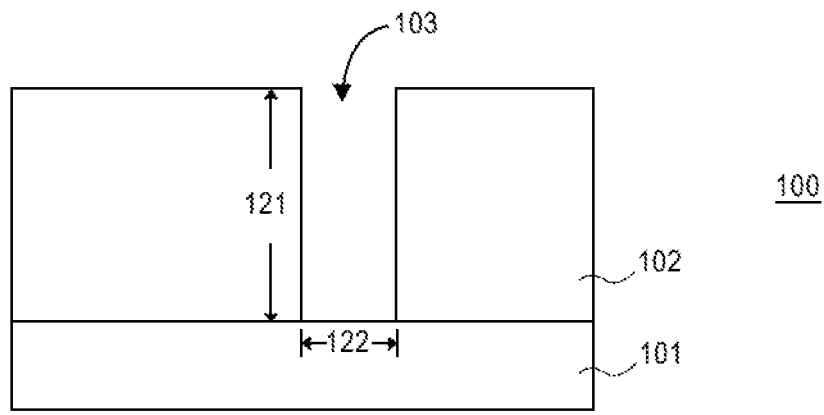
FIG. 1 shows a cross-sectional view of an electronic device structure according to one embodiment.

In the following description, numerous specific details, such as specific materials, dimensions of the elements, etc. are set forth in order to provide thorough understanding of one or more of the embodiments as described herein. It will be apparent, however, to one of ordinary skill in the art that the one or more embodiments as described herein may be practiced without these specific details. In other instances, semiconductor fabrication processes, techniques, materials, equipment, etc., have not been described in great detail to avoid unnecessary obscuring of this description.

While certain exemplary embodiments are described and shown in the accompanying drawings, it is to be understood that such embodiments are merely illustrative and not restrictive, and that the embodiments are not restricted to the specific constructions and arrangements shown and described because modifications may occur to those ordinarily skilled in the art.

Reference throughout the specification to "one embodiment", "another embodiment", or "an embodiment" means that a particular feature, structure, or characteristic described in connection with the embodiment is included in at least one embodiment. Thus, the appearance of the phrases, such as "one embodiment" and "an embodiment" in various places throughout the specification are not necessarily all referring to the same embodiment. Furthermore, the particular features, structures, or characteristics may be combined in any suitable manner in one or more embodiments.

Moreover, inventive aspects lie in less than all the features of a single disclosed embodiment. Thus, the claims following the Detailed Description are hereby expressly incorporated into this Detailed Description, with each claim standing on its own as a separate embodiment. While the exemplary embodiments have been described herein, those skilled in the art will recognize that these exemplary embodiments can be practiced with modification and alteration as described herein. The description is thus to be regarded as illustrative rather than limiting.

Methods and apparatuses to manufacture selective epitaxally grown III-V materials based devices are described herein. A first buffer layer is deposited into a trench in an insulating layer on a substrate. A second buffer layer is deposited onto the first buffer layer. A device layer is deposited on the second buffer layer. In an embodiment, the second buffer layer has a lattice parameter that matches the lattice parameter of the device channel layer. In an embodiment, the first buffer layer has a lattice parameter between the lattice parameter of the substrate and the device channel layer. In an embodiment, at least one of the first buffer layer, second buffer layer, and device layer is a III-V material based layer, and the substrate is a silicon substrate. In an embodiment, a cap layer is deposited on the device layer. In an embodiment, a fin comprising the device layer on the second buffer layer on a portion of the first buffer layer is formed. In an embodiment, a gate dielectric is deposited over the fin; and source and drain regions are formed in the fin. In an embodiment, the device layer includes a channel layer.

It at least some embodiments, a multilayer stack comprises a first III-V material based buffer layer on a silicon substrate. A second III-V material based buffer layer is deposited onto the first III-V materials based buffer layer. The multilayer stack comprising the second III-V material based buffer layer on the first III-V materials based buffer layer is deposited in a trench in an insulating layer on the silicon substrate. The multilayer stack described herein allows III-V material integration on silicon using selective epitaxy approach. Selective epitaxial growth involves growing the multi-layer stack in the trench in the insulating layer on the silicon substrate. The trench in the insulating layer on the substrate has an aspect ratio (depth to width (D/W) such that the defects originating from the lattice mismatch growth are captured within the buffer layers deposited in the trench.

Buffer layers grown selectively between the substrate and a device layer provide an advantage of capturing dislocation defects within the bottom buffer layers reducing the defects that propagate to the device layers. The layer stack combination as described herein provides an advantage of accommodating greater lattice mismatch between Si substrate and the III-V device layer. In an embodiment, the III-V device layer is InGaAs with high indium ("In") composition (e.g., at least 53%).

Embodiments of a layer stack comprising multiple buffer layers as described herein accommodates lattice mismatch between Si substrate and the III-V device channel layer. The hetero-integrated solution described herein can be utilized to make any device architecture e.g., a trigate device, nanowires, nanoribbons, and the like.

FIG. 1 shows a cross-sectional view 100 of a III-V materials based electronic device structure according to one embodiment. A trench 103 is formed in an insulating layer 102 to expose a substrate 101.

In one embodiment, the substrate 101 includes a semiconductor material, e.g., monocrystalline silicon ("Si"), germanium ("Ge"), silicon germanium ("SiGe"), a III-V materials based material e.g., gallium arsenide ("GaAs"), or any combination thereof. In one embodiment, the substrate 101 includes metallization interconnect layers for integrated circuits. In at least some embodiments, the substrate 101 includes electronic devices, e.g., transistors, memories, capacitors, resistors, optoelectronic devices, switches, and any other active and passive electronic devices that are separated by an electrically insulating layer, for example, an interlayer dielectric, a trench insulation layer, or any other insulating layer known to one of ordinary skill in the art of the electronic device manufacturing. In at least some embodiments, the substrate 101 includes interconnects, for example, vias, configured to connect the metallization layers.

In an embodiment, substrate 101 is a semiconductor-on-isolator (SOI) substrate including a bulk lower substrate, a middle insulation layer, and a top monocrystalline layer. The top monocrystalline layer may comprise any material listed above, e.g., silicon.

Insulating layer 102 can be any material suitable to insulate adjacent devices and prevent leakage. In one embodiment, electrically insulating layer 102 is an oxide layer, e.g., silicon dioxide, or any other electrically insulating layer determined by an electronic device design. In one embodiment, insulating layer 102 comprises an interlayer dielectric (ILD), e.g., silicon dioxide. In one embodiment, insulating layer 102 may include polyimide, epoxy, photodefinable materials, such as benzocyclobutene (BCB), and WPR-series materials, or spin-on-glass. In one embodiment, insulating layer 102 is a low permittivity (low-k) ILD layer. Typically, low-k is referred to the dielectrics having dielectric constant (permittivity k) lower than the permittivity of silicon dioxide.

In one embodiment, insulating layer 102 is a shallow trench isolation (STI) layer to provide field isolation regions that isolate one fin from other fins on substrate 101. In one embodiment, the thickness of the layer 102 is in the approximate range of 500 angstroms (Å) to 10,000 Å. The insulating layer 102 can be blanket deposited using any of techniques known to one of ordinary skill in the art of electronic device manufacturing, such as but not limited to a chemical vapour deposition (CVD), and a physical vapour deposition (PVP).

In an embodiment, the insulating layer 102 is patterned and etched to form trenches, such as trench 103 using one of the patterning and etching techniques known to one of ordinary skill in the art of electronic device manufacturing. Trench 103 has a depth D 121 and a width W 122. An aspect ratio of the trench 103 (D/W) determines the thickness of the buffer layers deposited through that trench. Higher the D/W ratio of the trench, more thick are the buffer layers. In an embodiment, the buffer layers deposited through the trench onto the substrate are thick enough, so that most of the defects originated from the lattice mismatch are trapped within that buffer layers and are prevented from being propagated into a device layer formed on the buffer layers. In an embodiment, the aspect ratio of the trench (D/W) is at least 1.5, and more specifically, at least 3. In an embodiment, the width of the trench is determined by the width of the electronic device. The electronic device can be for example a tri-gate device, a nanowire based device, a nanoribbons based device, or any other electronic device. For example, the width of the trench 103 for a tri-gate transistor can be from about 5 nm to about 80 nm. For example, the width of the trench 103 for a nanotube device or a nanowire device can be from about 5 nm to about 80 nm. In an embodiment, the depth of the trench is at least three times greater than the width of the trench. For example, for a tri-gate transistor the depth of the trench 103 can be from about 250 nanometers ("nm") to about 400 nm, and more specifically, from about 300 nm to about 350 nm.

The trench 103 in the insulating layer 102 can have a square, rectangular, round, oval, or any other shape to expose the underlying substrate 101. In at least some embodiments, the width of the trench is from about 20 nm to about 300 nm. In at least some embodiments, the depth of the trench is from about 60 nm to about 600 nm.

Figure 2:
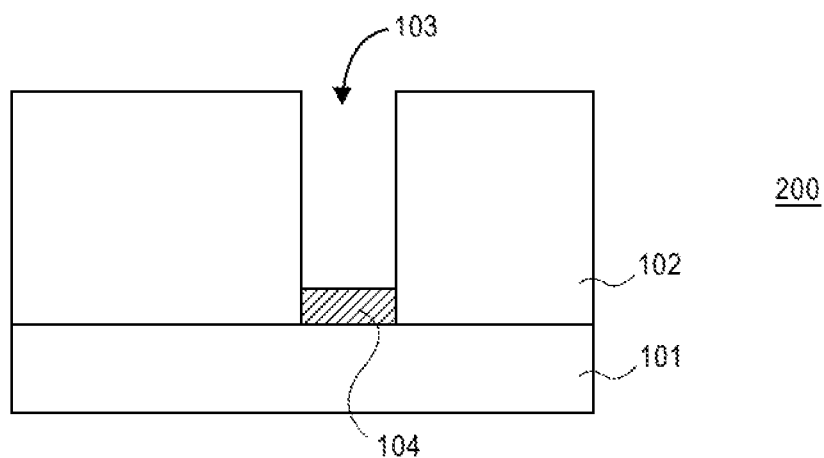
FIG. 2 is a cross-sectional view similar to FIG. 1, after a first buffer layer is deposited on a substrate according to one embodiment.

FIG. 2 is a cross-sectional view 200 similar to FIG. 1, after a first buffer layer is deposited on a substrate according to one embodiment. A first buffer layer 104 is selectively deposited through trench 103 onto the exposed portion of substrate 101. In an embodiment, buffer layer 104 has a lattice parameter between the lattice parameter of the substrate 101 and a device layer which is formed thereon. Generally, a lattice constant is a lattice parameter that is typically referred as a distance between unit cells in a crystal lattice. Lattice parameter is a measure of the structural compatibility between different materials.

Material for the buffer layer 104 is chosen such that the lattice constant of the first buffer layer 104 ("$LC_1$") is in between the lattice constant of Si ("$LC_{si}$") and a device channel layer ("$LC_{dc}$"). In an embodiment, substrate 101 is a silicon substrate, and buffer layer 104 comprises a III-V material. Generally, the III-V material refers to a compound semiconductor material that comprises at least one of group III elements of the periodic table, such as aluminum ("Al"), gallium ("Ga"), indium ("In"), and at least one of group V elements of the periodic table, such as nitrogen ("N"), phosphorus ("P"), arsenic ("As"), antimony ("Sb"). In an embodiment, buffer layer 104 is InP, GaAs, InAlAs, other III-V material, or any combination thereof. In an embodiment, the lattice constant of the first buffer layer 104 is such that a ratio $R=(LC_1-LC_{si})/LC_{si}$ is from about 4% to about 8%.

In an embodiment, the thickness of the first buffer layer 104 is at least about 50 nanometers ("nm"), and more specifically, at least about 70 nm.

In an embodiment, buffer layer 104 is deposited through trench 103 onto the exposed portion of substrate 101 using a selective area epitaxy. As shown in FIG. 2, epitaxial buffer layer 104 is locally grown on the exposed portion of semiconductor substrate 101 through trench 103. Epitaxial buffer layer 104 can be selectively deposited through trench 103 onto the exposed portion of substrate 101 using one of epitaxial techniques known to one of ordinary skill in the art of electronic device manufacturing, e.g., chemical vapor deposition ("CVD"), metallo organic chemical vapor deposition ("MOCVD"), atomic layer deposition ("ALD"), or other epitaxial growth technique known to one of ordinary skill in the art of electronic device manufacturing. In an embodiment, the first epitaxial buffer layer of InP is deposited through trench 103 onto the exposed portion of substrate 101 by a MOCVD technique at temperature from about 400° C. to about 650° C., and more specifically, at about 500° C.

Figure 3:
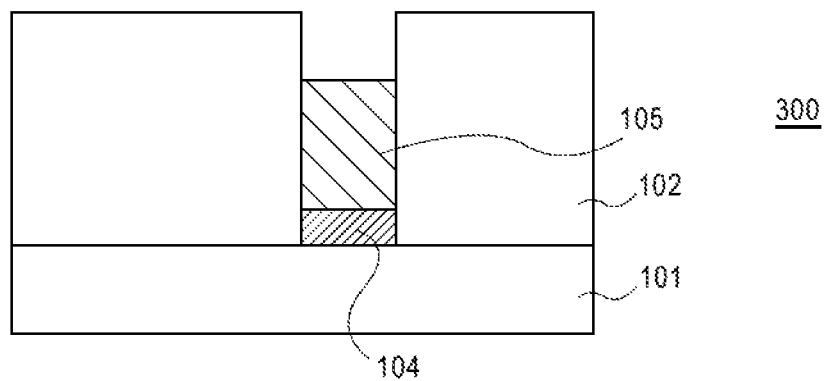
FIG. 3 is a cross-sectional view similar to FIG. 2, after a second buffer layer is deposited onto the first buffer layer according to one embodiment.

FIG. 3 is a cross-sectional view 300 similar to FIG. 2, after a second buffer layer is deposited onto the first buffer layer according to one embodiment. A second buffer layer 105 is selectively deposited through trench 103 onto buffer layer 104. In an embodiment, second buffer layer 105 comprises a III-V material. In an embodiment, second buffer layer 105 is indium aluminum arsenide ("$In_xAl_{1-x}As$"), indium gallium arsenide antimonide ("$In_xGa_{1-x}AsSb$"), other III-V material, or any combination thereof. In an embodiment, second buffer layer 105 of one III-V material based is deposited onto the first buffer layer 104 of another III-V material. In an embodiment, second III-V material based buffer layer 105 has a lattice parameter that matches the lattice parameter of a III-V material based device channel layer. In an embodiment, second III-V material based buffer layer 105 has a lattice parameter that matches the lattice parameter of the device layer of the III-V material that has high indium content (at least 53% by weight), e.g., $In_xAl_{1-x}As$ layer, $In_xGa_{1-x}AsSb$ layer, where x is at least 0.53. In more specific embodiment, second buffer layer 105 has a lattice parameter that matches the lattice parameter of the device layer of the III-V material that has at least 70% atom fraction of indium content e.g., ("$In_xAl_{1-x}As$", $In_xGa_{1-x}AsSb$"), where x is at least 0.7.

In an embodiment, the device channel layer is indium gallium arsenide ("InGaAs"), and buffer layer 105 is InAlAs, InGaAsSb, or any combination thereof. In an embodiment, the choice of second buffer material that has a bottom interface with the first buffer layer and a top interface with the device channel layer is such that the lattice constant of the second buffer layer matches the lattice constant of the InGaAs channel layer. In an embodiment, the thickness of the second buffer layer 105 is at least about 200 nm.

In an embodiment, buffer layer 105 is deposited through trench 103 onto the buffer layer 104 using a selective area epitaxy. As shown in FIG. 2, epitaxial buffer layer 105 is locally grown on the first buffer layer 104 through trench 103. Epitaxial buffer layer 105 can be selectively deposited through trench 103 onto the first buffer layer 104 using one of epitaxial techniques known to one of ordinary skill in the art of electronic device manufacturing, e.g., chemical vapor deposition ("CVD"), metallo organic chemical vapor deposition ("MOCVD"), atomic layer deposition ("ALD"), or other epitaxial growth technique known to one of ordinary skill in the art of electronic device manufacturing. In an embodiment, the second epitaxial buffer layer InAlAs is deposited through trench 103 onto the first buffer layer 104 by a MOCVD technique at temperature from about 425° C. to about 650° C., and more specifically, from about 450° C. to about 650° C.

Figure 4:
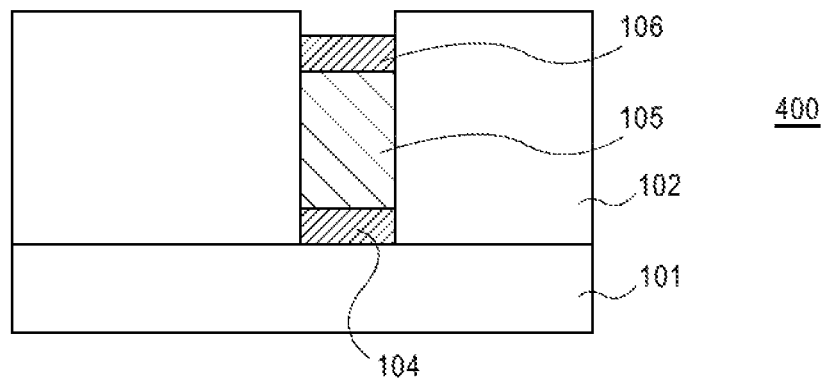
FIG. 4 is a cross-sectional view similar to FIG. 3, after a device layer is deposited onto the second buffer layer according to one embodiment.

FIG. 4 is a cross-sectional view 400 similar to FIG. 3, after a device layer is deposited onto the second buffer layer according to one embodiment. A device layer 106 is selectively deposited through trench 103 onto second buffer layer 105. In an embodiment, device layer 106 comprises a device channel layer. The second buffer layer 105 has a lattice parameter that matches the lattice parameter of device layer 106. In an embodiment, device layer 106 comprises a III-V material, for example, InGaAs, InGaAsSb that has high indium content (e.g., at least 53% by weight (e.g., $In_xGa_{1-x}As$, $In_xGa_{1-x}AsSb$, where x is at least 0.53). In an embodiment, device layer 105 comprises InGaAs, InGaAsSb that contains at least 70% of indium (e.g., $In_xGa_{1-x}As$, $In_xGa_{1-x}AsSb$, where x is at least 0.7).

In an embodiment, the device channel layer 106 is InGaAs and the second buffer layer 105 is InAlAs, InGaAsSb, or any combination thereof. In an embodiment, the lattice constant of the III-V material of the second buffer layer matches the lattice constant of the III-V material of the device layer 106, as described above. The thickness of the device layer 106 determined by a device design. In an embodiment, the thickness of the device layer 106 is from about 5 nm to about 100 nm.

In an embodiment, device layer 106 is deposited through trench 103 onto the buffer layer 105 using a selective area epitaxy. As shown in FIG. 4, device layer 106 is locally grown on the buffer layer 105 through trench 103. Epitaxial device layer 106 can be selectively deposited through trench 103 onto the buffer layer 105 using one of epitaxial techniques known to one of ordinary skill in the art of electronic device manufacturing, e.g., chemical vapor deposition ("CVD"), metallo organic chemical vapor deposition ("MOCVD"), atomic layer deposition ("ALD"), or other epitaxial growth technique known to one of ordinary skill in the art of electronic device manufacturing. In an embodiment, the device layer of InGaAs is deposited through trench 103 onto the buffer layer 105 by a MOCVD technique at temperature from about 400° C. to about 650° C.

Figure 5:
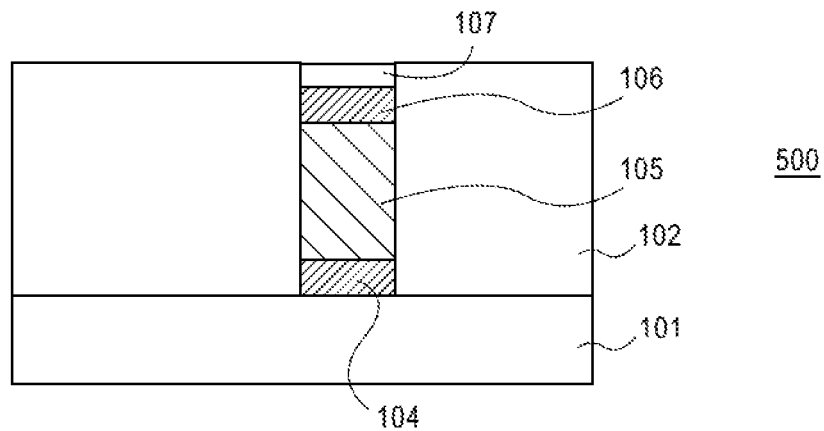
FIG. 5 is a cross-sectional view similar to FIG. 4, after a thin cap layer is optionally grown on the device layer according to one embodiment.

FIG. 5 is a cross-sectional view 500 similar to FIG. 4, after a thin cap layer is optionally grown on the device layer according to one embodiment. A thin cap layer can be optionally deposited onto the device layer 106 as an interface with high-k gate dielectrics, e.g., TaSiOx, to improve the control of the gate. A thin cap layer 107 can be selectively deposited through trench 103 onto device layer 106. In an embodiment, cap layer 107 comprises a III-V material. In an embodiment, cap layer 107 is InP. In an embodiment, the thickness of the cap layer 107 is from about 0.5 nm to about 3 nm.

In an embodiment, cap layer 107 is deposited through trench 103 onto the device layer 106 using a selective area epitaxy. As shown in FIG. 5, cap layer 107 is locally grown on the device layer 107 through trench 103. Cap layer 107 can be selectively deposited through trench 103 onto the device layer 106 using one of epitaxial techniques known to one of ordinary skill in the art of electronic device manufacturing, e.g., chemical vapor deposition ("CVD"), metallo organic chemical vapor deposition ("MOCVD"), atomic layer deposition ("ALD"), or other epitaxial growth technique known to one of ordinary skill in the art of electronic device manufacturing.

Figure 6:
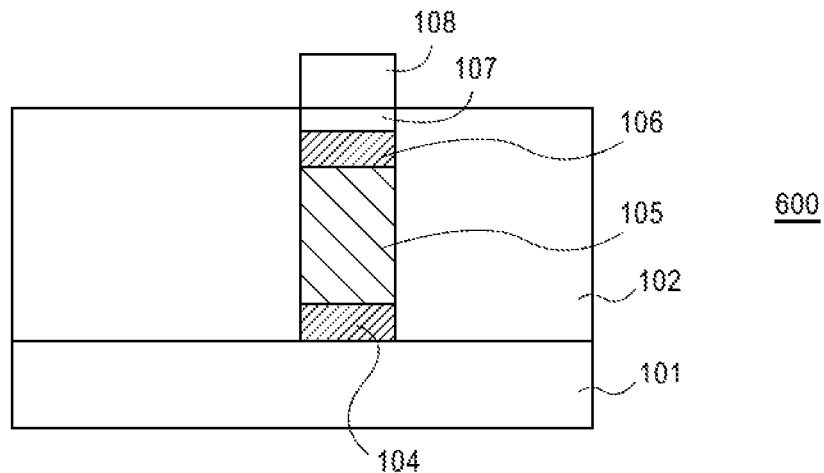
FIG. 6 is a cross-sectional view similar to FIG. 5, after a heavily doped layer is deposited over the device layer according to one embodiment.

FIG. 6 is a cross-sectional view 600 similar to FIG. 5, after a heavily doped layer is deposited over the device layer according to one embodiment. In an embodiment, heavily doped layer 108 is deposited over the device layer to provide a source and a drain for a transistor device. As shown in FIG. 6, a multilayer stack is selectively grown in the trench 103 on substrate 101 that comprises a heavily doped layer 108 on cap layer 107 on device layer 106 on second buffer layer 105 on first buffer layer 104 on substrate 101. In an embodiment, heavily source/drain doped layer 108 is removed from the gate region later in a process and left in source/drain regions during transistor fabrication.

In an embodiment, heavily doped source/drain layer 108 comprises a material. In an embodiment, heavily doped layer 108 has a concentration of dopants between $1 \times 10^{19}$ and $1 \times 10^{21}$ atoms/cm$^3$ and comprises the III-V material that is similar to the material of the device layer 107. In an embodiment, the thickness of the source/drain layer 108 is determined by a device design. In an embodiment, the thickness of the source/drain layer 108 is from about 10 nm to about 100 nm. In more specific embodiment, the thickness of the source/drain layer 108 is about 20 nm. In an embodiment, source/drain layer 108 is deposited through trench 103 onto the cap layer 107 using a selective area epitaxy. Source/drain layer 108 can be selectively deposited through trench 103 onto the cap layer 107 using one of epitaxial techniques known to one of ordinary skill in the art of electronic device manufacturing, e.g., chemical vapor deposition ("CVD"), metallo organic chemical vapor deposition ("MOCVD"), atomic layer deposition ("ALD"), or other epitaxial growth technique known to one of ordinary skill in the art of electronic device manufacturing.

Figure 11:
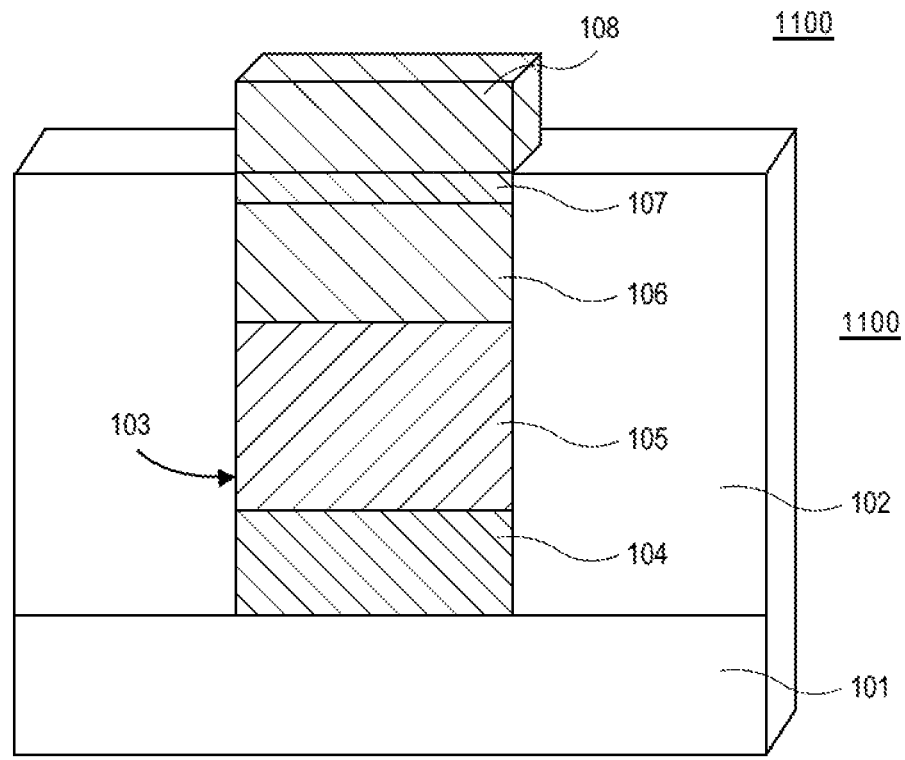
FIG. 11 is a perspective view of the multilayer stack as depicted in FIG. 6 according to one embodiment.

FIG. 11 is a perspective view 1100 of the multilayer stack as depicted in FIG. 6 according to one embodiment. A multilayer stack to manufacture an electronic device comprises a first buffer layer 104 in a trench formed in an insulating layer 102 on a substrate 101. A second buffer layer 105 is deposited on the first buffer layer 104 and a device channel layer 106 on the second buffer layer. The second buffer layer 105 has a lattice parameter that matches the lattice parameter of the device channel layer 106. The first buffer layer 104 has a lattice parameter between the lattice parameter of the substrate 101 and the device channel layer 106, as described above.

In an embodiment, each of the first buffer layer 104, second buffer layer 105, and device channel layer 106 is a III-V material based layer, and the substrate 101 is a silicon substrate, as described above. A cap layer 107 is optionally deposited on the device channel layer 106, as described above. In an embodiment, each of the first buffer layer 104; the second buffer layer 105, the device channel layer 106, and the cap layer 107 is deposited by a chemical vapor deposition, as described above.

Typically, when lattice mismatched films are incorporated together, defects are formed. These defects once formed, propagate up the lattice at an angle. The multilayer stack to manufacture an electronic device comprising a first buffer layer 104 in a trench 103 in an insulating layer 102 on a substrate 101, a second buffer layer 105 on the first buffer layer 104; and a device channel layer 106 on the second buffer layer 105, wherein the second buffer layer 105 has a lattice parameter that matches the lattice parameter of the device channel layer 106, and wherein the first buffer layer 104 has a lattice parameter between the lattice parameter of the substrate 101 and the device channel layer 106 allows to move a defect terminated interface well below the actual device channel layer 106 such that device performance is not affected.

Figure 7:
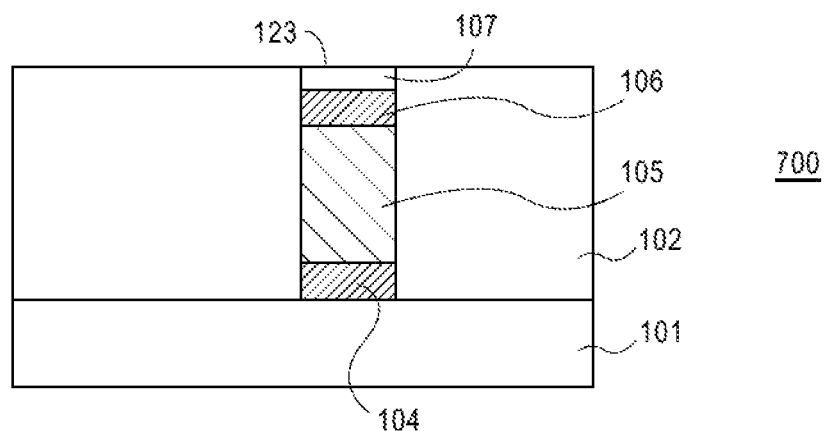
FIG. 7 is a cross-sectional view similar to FIG. 6, after heavily doped source/drain layer is removed from a gate region of the device according to one embodiment.

FIG. 7 is a cross-sectional view 700 similar to FIG. 6, after heavily doped source/drain layer is removed from a gate region 123 of the device according to one embodiment. Heavily doped source/drain layer 108 is left intact on source/drain regions (not shown) of the device layer 106.

Figure 8:
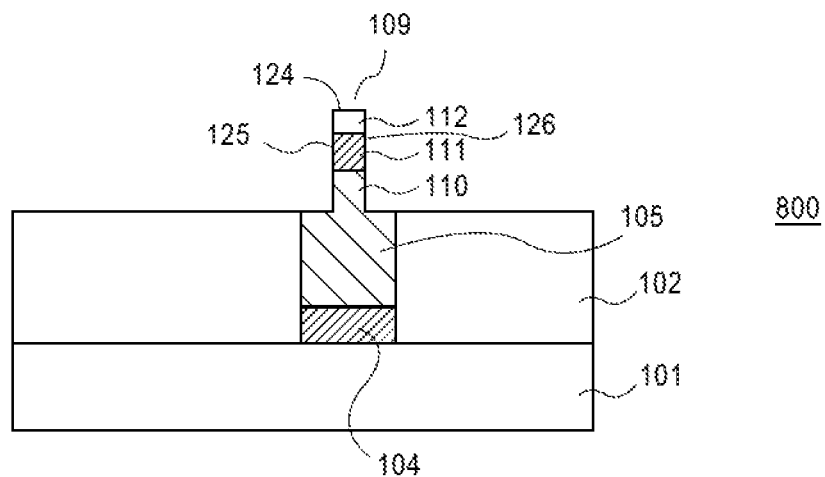
FIG. 8 is a cross-sectional view similar to FIG. 7, after a device fin is formed according to one embodiment.

FIG. 8 is a cross-sectional view 800 similar to FIG. 7, after a device fin is formed according to one embodiment. As shown in FIG. 8, a device fin 109 comprises a portion of the optional cap layer 112 on a portion of the device layer 111 on a portion of the second buffer layer 110. As shown in FIG. 8, fin 108 has a top surface 124, and opposing sidewalls 125 and 126. In an embodiment, forming fin 109 involves depositing a patterned hard mask onto cap layer 107 and then recessing insulating layer 102 down to a depth determined by a device design as known to one of ordinary skill in the art of electronic device manufacturing. In one embodiment, insulating layer 102 is recessed by a selective etching technique while leaving the fin 109 intact. For example, insulating layer 102 can be recessed using a selective etching technique known to one of ordinary skill in the art of electronic device manufacturing, such as but not limited to a wet etching, and a dry etching with the chemistry having substantially high selectivity to the fin on the substrate 101. This means that the chemistry predominantly etches the insulating layer 102 rather than the fin of the substrate 101. In one embodiment, a ratio of the etching rates of the insulating layer 102 to the fin is at least 10:1.

As shown in FIG. 8, the patterned hard mask is removed from the fin 109. The patterned hard mask layer can be removed from the top of the fin 109 by a polishing process, such as a CMP as known to one of ordinary skill in the art of electronic device manufacturing. As shown in FIG. 8, insulating layer 102 is recessed down to a predetermined depth that defines the height of the device fin 109 relative to a top surface of the insulation layer 102. The height and the width of the fin 109 are typically determined by a design. In an embodiment, the height of the fin 109 is from about 10 nm to about 100 nm and the width of the fin 109 is from about 5 nm to about 20 nm.

Figure 9:
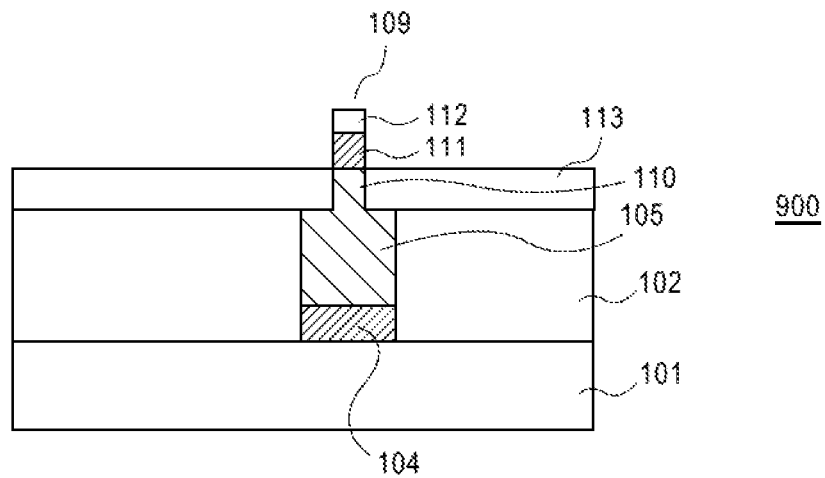
FIG. 9 is a cross-sectional view similar to FIG. 8, after an insulating layer is deposited onto insulating layer adjacent to the sidewalls of the portion of the first buffer layer according to one embodiment.

FIG. 9 is a cross-sectional view 900 similar to FIG. 8, after an insulating layer 113 is deposited onto insulating layer 102 adjacent to the sidewalls of the portion of the first buffer layer 110 according to one embodiment. In an embodiment, insulating layer 113 can be any material suitable to insulate adjacent devices and prevent leakage from the fins. In one embodiment, electrically insulating layer 113 is an oxide layer, e.g., silicon dioxide, or any other electrically insulating layer determined by a design. In one embodiment, insulating layer 113 is a STI layer to provide field isolation regions that isolate one fin from other fins on substrate 101. In one embodiment, the thickness of the insulating layer 113 corresponds to the thickness of the portion of the second buffer layer 110 that is determined by a fin device design. In an embodiment, the thickness of the insulating layer 113 is in the approximate range of 1 nm to about 30 nm. The insulating layer 113 can be blanket deposited using any of techniques known to one of ordinary skill in the art of electronic device manufacturing, such as but not limited to a chemical vapour deposition (CVD), and a physical vapour deposition (PVP).

Figure 10:
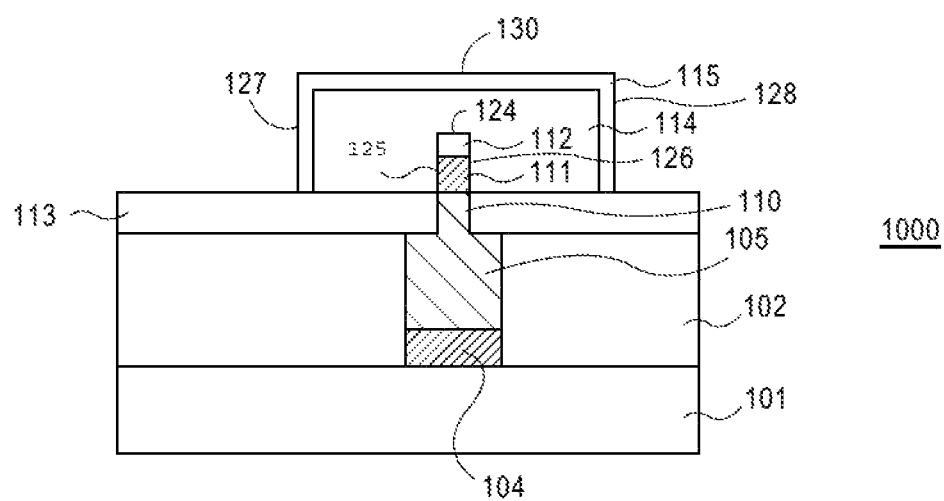
FIG. 10 is a cross-sectional view similar to FIG. 9, after a gate dielectric layer and a gate electrode layer are deposited over the fin according to one embodiment.

FIG. 10 is a cross-sectional view 1000 similar to FIG. 9, after a gate dielectric layer and a gate electrode layer are deposited over the fin according to one embodiment. A gate dielectric layer 114 is formed on and around three sides of the semiconductor fin 109. As shown in FIG. 10, gate dielectric layer 114 is formed on or adjacent to top surface 124, on or adjacent to sidewall 125, and on or adjacent to sidewall 126 of fin 109. Gate dielectric layer 114 can be any well-known gate dielectric layer.

In one embodiment, gate dielectric layer 114 is a high-k dielectric material having a dielectric constant greater than the dielectric constant of silicon dioxide. In one embodiment, electrically insulating layer 114 comprises a high-k dielectric material, such as a metal oxide dielectric. For example, gate dielectric layer 114 can be but not limited to tantalum silicon oxide (TaSiOx), tantalum pentaoxide ($Ta_2O_5$), and titantium oxide ($TiO_2$) zirconium oxide ($ZrO_2$), hafnium oxide ($HfO_2$), lanthanum oxide ($La_2O_4$), lead zirconium titanate (PZT), other high-k dielectric material, or a combination thereof. In an embodiment, the gate dielectric layer 114 is a silicon dioxide ($SiO_2$), silicon oxynitride ($SiO_xN_y$) or a silicon nitride ($Si_3N_4$) dielectric layer. In an embodiment, the thickness of the gate dielectric layer 114 is in the approximate range between about 1 nm to about 20 nm, and more specifically, between about 5 nm to about 10 nm.

As shown in FIG. 10, a gate electrode layer 115 is deposited on the gate dielectric layer 114 on the fin 109. Gate electrode 115 is formed on and around the gate dielectric layer 114 as shown in FIG. 10. Gate electrode 115 is formed on or adjacent to gate dielectric 114 on sidewall 125 of semiconductor fin 109, is formed on gate dielectric 114 on the top surface 124 of semiconductor fin 109, and is formed adjacent to or on gate dielectric layer 114 on sidewall 125 of semiconductor fin 109.

As shown in FIG. 10, gate electrode 115 has a top 130 and a pair of laterally opposite sidewalls, such as a sidewall 127 and a sidewall 128 separated by a distance which defines the length of the channel of the fin device. Gate electrode 115 can be formed of any suitable gate electrode material. In an embodiment, the gate electrode 115 is a metal gate electrode, such as but not limited to, tungsten, tantalum, titanium, and their nitrides. It is to be appreciated, the gate electrode 115 need not necessarily be a single material and can be a composite stack of thin films, such as but not limited to a polycrystalline silicon/metal electrode or a metal/polycrystalline silicon electrode. In an embodiment, gate electrode 115 comprises of polycrystalline silicon doped to a concentration density between $1\times10^{19}$ atoms/$cm^3$ to $1\times10^{20}$ atoms/$cm^3$.

Figure 12:
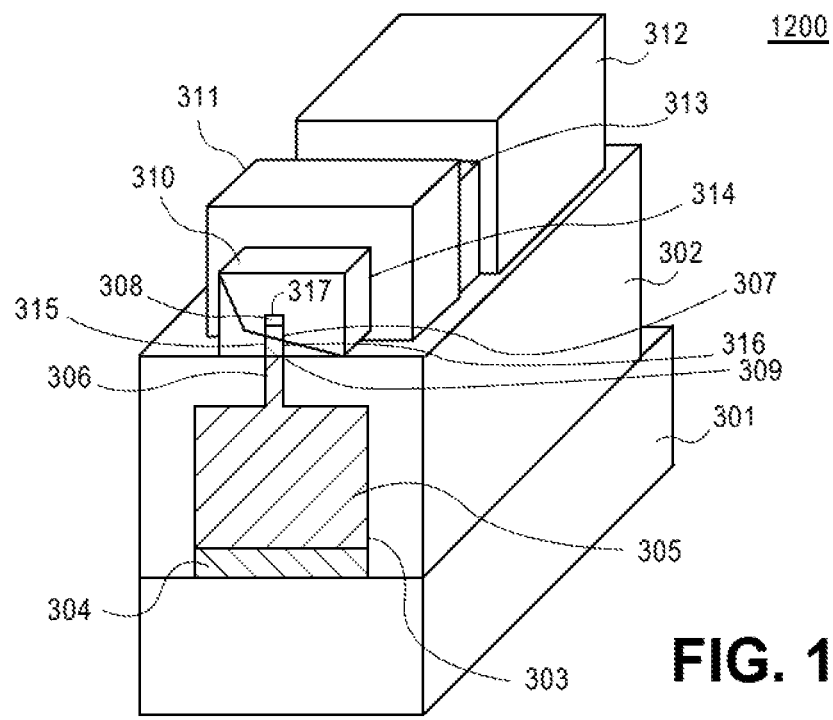
FIG. 12 is a perspective view of a portion of a tri-gate transistor as depicted in FIG. 10 according to one embodiment.

FIG. 12 is a perspective view 1200 of a portion of a tri-gate transistor as depicted in FIG. 10 according to one embodiment. As shown in FIG. 12, a tri-gate transistor includes an electrically insulating layer 302 on a substrate 301 adjacent to a fin 309. In one embodiment, the tri-gate transistor is coupled to one or more layers of metallization (not shown). The one or more metallization layers can be separated from adjacent metallization layers by dielectric material, e.g., interlayer dielectric (ILD) (not shown). The adjacent metallization layers may be electrically interconnected by vias (not shown).

As shown in FIG. 12, a fin 309 protrudes from a top surface of insulating layer 302. Fin 309 comprises an optional III-V material based cap layer 308 on a III-V material based device channel layer 307 on a portion 306 of a III-V material based second buffer layer 305 on a III-V material based first buffer layer 304. A gate electrode 311 is formed on and around the gate dielectric 310.

The fin 309 comprising an optional III-V material based cap layer 308 on a III-V material based device channel layer 307 on a portion 306 of a III-V material based second buffer layer 305 on a III-V material based first buffer layer 304, wherein the second buffer layer has a lattice parameter that matches the lattice parameter of the device channel layer, and wherein the first buffer layer has a lattice parameter between the lattice parameter of the substrate and the device layer provides accommodation of the lattice mismatch between the substrate 301 and the device channel layer 307 such that defects can be captured within the thickness of the buffer layers 304 and 305.

As shown in FIG. 12, fin 309 has a pair of opposing sidewalls separated by a distance which defines a semiconductor fin width. In one embodiment, the fin width is in an approximate range from about 5 nm to about 50 nm. In one embodiment, the length of the fins is greater than the width and is determined by a design. In one embodiment, the length of the fins is from about 50 nm to hundreds of microns. In an embodiment, the fin height above the top surface of the insulating layer 302 is in an approximate range from about 5 nm to about 500 nm.

As shown in FIG. 12, a gate electrode 311 is deposited on the gate dielectric 310 on the fin 309. Gate electrode 311 is formed on and around the gate dielectric 310. A source region and a drain region are formed at opposite sides of the gate electrode 311 in a device layer portion 313 of the fin 309. One of source/drain electrodes 312 is formed on the source/drain region at one side of gate electrode 311, and another one of source/drain electrodes (not shown) is formed on the source/drain region at an opposite side of gate electrode 311 using one of techniques known to one of ordinary skill in the art of electronic device manufacturing.

The source and drain regions are formed of the same conductivity type such as N-type or P-type conductivity. In an embodiment, the source and drain regions have a doping concentration of between $1\times10^{19}$, and $1\times10^{21}$ atoms/$cm^3$. The source and drain regions can be formed of uniform concentration or can include sub-regions of different concentrations or doping profiles such as tip regions (e.g., source/drain extensions). In an embodiment, the source and drain regions have the same doping concentration and profile. In an embodiment, the doping concentration and profile of the source and drain regions, can vary in order to obtain a particular electrical characteristic. The portion of the fin 309 located between the source region and drain region, defines a channel region 314 of the transistor.

The channel region 314 can also be defined as the area of the semiconductor fin 309 surrounded by the gate electrode 311. At times however, the source/drain region may extend slightly beneath the gate electrode through, for example, diffusion to define a channel region slightly smaller than the gate electrode length (Lg). In an embodiment, channel region 314 is intrinsic or undoped. In an embodiment, channel region 314 is doped, for example to a conductivity level of between $1\times10^{16}$ to $1\times10^{19}$ atoms/cm$^3$. In an embodiment, when the channel region is doped it is typically doped to the opposite conductivity type of the source/drain region. For example, when the source and drain regions are N-type conductivity the channel region would be doped to p type conductivity. Similarly, when the source and drain regions are P type conductivity the channel region would be N-type conductivity. In this manner a tri-gate transistor 100 can be formed into either a NMOS transistor or a PMOS transistor respectively.

Channel regions, such as channel region 314 can be uniformly doped or can be doped non-uniformly or with differing concentrations to provide particular electrical and performance characteristics. For example, channel regions, such as channel region 314 can include well-known halo regions, if desired. As shown in FIG. 12, the tri-gate transistor has a dielectric 310 and a gate electrode 311 surrounding the semiconductor fin 309 on three sides that provides three channels on the fin 309, one channel extends between the source and drain regions on one sidewall of the fin, such as sidewall 315, a second channel extends between the source and drain regions on the top surface of the fin, such as surface 317, and the third channel extends between the source and drain regions on the other sidewall of the fin, such as sidewall 316.

In an embodiment, the source regions of the transistor 1200 are electrically coupled to higher levels of metallization (e.g., metal 1, metal 2, metal 3, and so on) to electrically interconnect various transistors of the array into functional circuits. In one embodiment, the drain regions of the transistor 1200 are coupled to higher levels of metallization (e.g., metal 1, metal 2, metal 3, and so on) to electrically interconnect various transistors of the array together into functional circuits.

Figure 13:
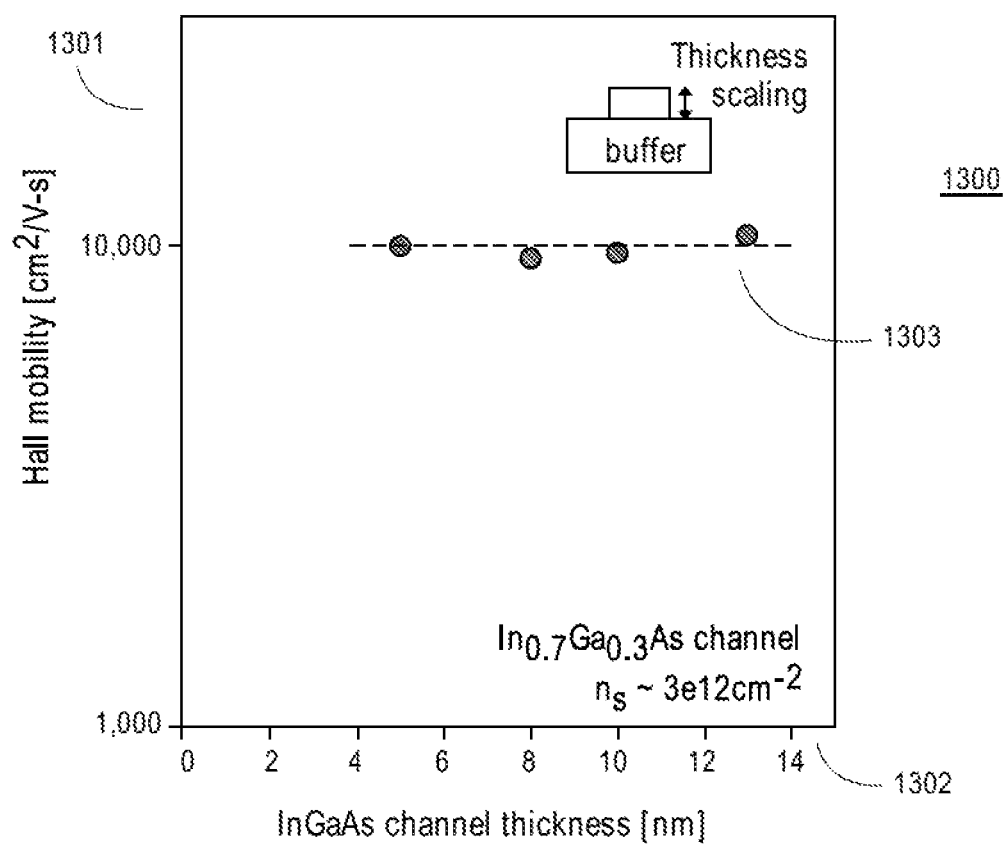
FIG. 13 is an exemplary graph showing a Hall mobility of carriers versus InGaAs channel thickness according to one embodiment.

FIG. 13 is an exemplary graph 1300 showing a Hall mobility of carriers (e.g., electrons, holes) 1301 versus InGaAs channel thickness 1302 according to one embodiment. InGaAs material with high (e.g., at least 70%) indium composition, such as In$_{0.7}$Ga$_{0.3}$As has high carrier mobility that makes it an attractive channel material option for a III-V device. Using InGaAs with high (e.g., at least 70%) indium composition, such as In$_{0.7}$Ga$_{0.3}$As as a device channel layer increases performance of the device and increases device gain. Data 1303 shows that Hall mobility is maintained high at about 10,000 cm$^2$/(V·s) down to a thin device body of 5 nm. There is no impact of surface roughness to mobility of carriers.

Figure 14:
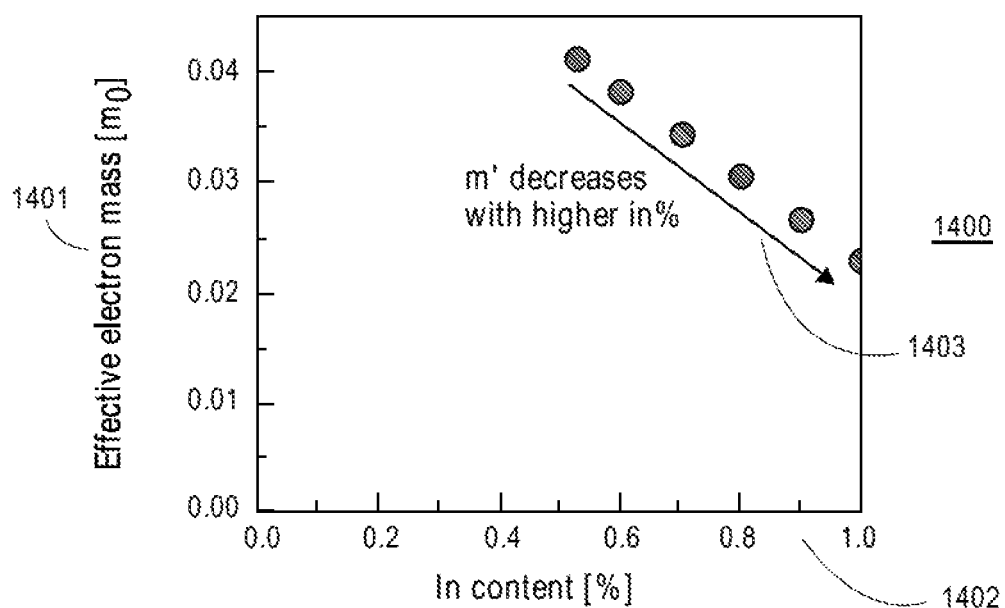
FIG. 14 is an exemplary graph showing an effective electron mass (m0) versus in content (%) according to one embodiment.

FIG. 14 is an exemplary graph 1400 showing an effective electron mass (m0) 1401 versus In content (%) 1402 according to one embodiment. Data 1403 indicate that m0 decreases with higher indium content (%). With a reference to FIG. 12, to increase the height of the fin ("H$_{si}$") of the fin in the tri-gate device made using InGaAs having high (e.g., 70%) indium content (e.g., In$_{0.7}$Ga$_{0.3}$As), the lattice mismatch between the channel (e.g., layer 307) and the bottom buffer adjacent to the channel (e.g., buffer layer 305) needs to be minimized. If the lattice mismatch is large, to prevent new defects generation, the thickness of the In$_{0.7}$Ga$_{0.3}$As (and hence H$_{Si}$) needs to be limited to a critical layer thickness. As a result, the bottom buffer layer adjacent to In$_{0.7}$Ga$_{0.3}$As device channel layer needs to have a lattice constant substantially the same (or close to) as the In$_{0.7}$Ga$_{0.3}$As channel. Similar lattice constants of the device channel layer, such as device channel layer 307 and the underlying portion of buffer layer, such as portion 306 of second buffer layer 305 allow (1) trigate H$_{Si}$ to be unlimited, (2) prevents any new defects to be generated at the channel/adjacent bottom buffer and (3) allows all defects that are created at an interface between the second buffer layer and the first buffer layer, such as between buffer layer 305 and buffer layer 304, and all defects that are created at an interface between first buffer layer and Si substrate, such as between buffer layer 304 and substrate 301 in the trench, such as a trench 303 to be captured well before the device channel layer, such as device channel layer 307.

Figure 15:
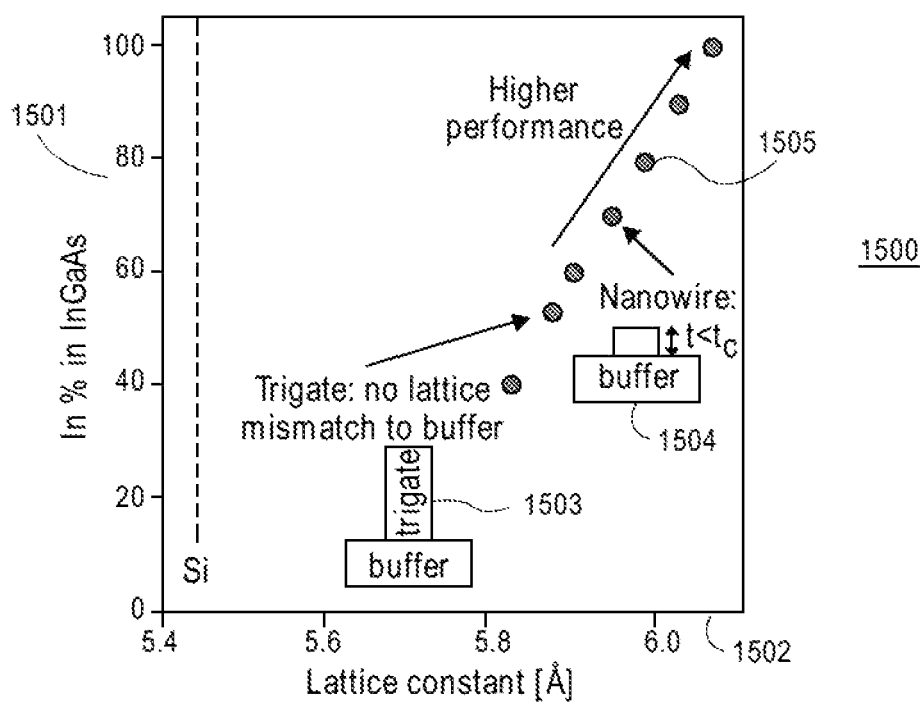
FIG. 15 is an exemplary graph showing an indium content in InGaAs versus a lattice constant according to one embodiment.

FIG. 15 is an exemplary graph 1500 showing an indium content in InGaAs 1501 versus a lattice constant 1502 according to one embodiment. As shown in FIG. 15 higher indium concentration in the InGaAs device allows easier to achieve gate all around ("GAA") silicon architecture. Increasing of indium content increases a lattice constant of InGaAs. As shown in FIG. 15, a trigate device 1503 needs a new buffer for In$_{0.7}$Ga$_{0.3}$As due to a critical layer thickness. A nanowire device 1504 has a thickness t less than a critical layer thickness tc (t<tc).

Data 1505 show that manufacturing a III-V material based device channel layer on a III-V material based second buffer layer on a III-V material based first buffer layer, wherein the second buffer layer has a lattice parameter that matches the lattice parameter of the device channel layer, and wherein the first buffer layer has a lattice parameter between the lattice parameter of the substrate and the device layer (e.g., a trigate on a buffer device 1503, a nanowire on a buffer device 1504) allow to increase the device performance.

Figure 16:
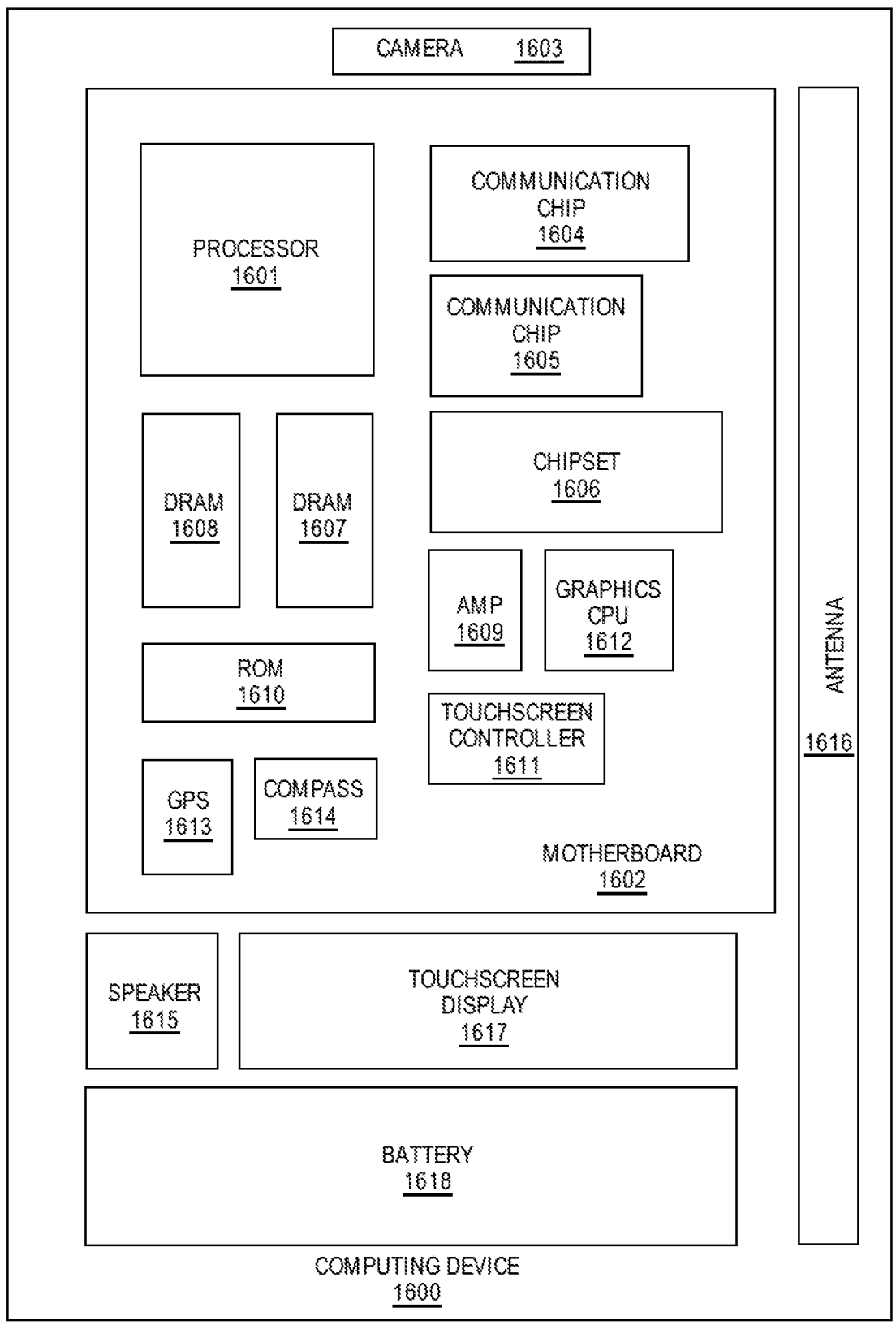
FIG. 16 illustrates a computing device 1600 in accordance with one embodiment.

FIG. 16 illustrates a computing device 1600 in accordance with one embodiment. The computing device 1600 houses a board 1602. The board 1602 may include a number of components, including but not limited to a processor 1601 and at least one communication chip 1604. The processor 1601 is physically and electrically coupled to the board 1602. In some implementations at least one communication chip is also physically and electrically coupled to the board 1602. In further implementations, at least one communication chip 1604 is part of the processor 1601.

Depending on its application, computing device 1600 may include other components that may or may not be physically and electrically coupled to the board 1602. These other components include, but are not limited to, a memory, such as a volatile memory 1608 (e.g., a DRAM), a non-volatile memory 1610 (e.g., ROM), a flash memory, a graphics processor 1612, a digital signal processor (not shown), a crypto processor (not shown), a chipset 1614, an antenna 1616, a display, e.g., a touchscreen display 1617, a display controller, e.g., a touchscreen controller 1611, a battery 1618, an audio codec (not shown), a video codec (not shown), an amplifier, e.g., a power amplifier 1609, a global positioning system (GPS) device 1613, a compass 1614, an accelerometer (not shown), a gyroscope (not shown), a speaker 1615, a camera 1603, and a mass storage device (such as hard disk drive, compact disk (CD), digital versatile disk (DVD), and so forth) (not shown).

A communication chip, e.g., communication chip 1604, enables wireless communications for the transfer of data to and from the computing device 1600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1604 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1600 may include a plurality of communication chips. For instance, a communication chip 1604 may be dedicated to shorter range wireless communications such as Wi-Fi and Bluetooth and a communication chip 1636 may be dedicated to longer range wireless communications such as GPS, EDGE, GPRS, CDMA, WiMAX, LTE, Ev-DO, and others.

In at least some embodiments, at least some of the components of the computing device 1600 (e.g., processor 1601, communication chip 1604, graphic CPU 1612) include a multilayer stack comprising a first III-V material based buffer layer in a trench in an insulating layer on a silicon substrate, a second III-V material based buffer layer on the first III-V material based buffer layer; and a III-V material based device layer on the second buffer layer, wherein the second III-V material based buffer layer has a lattice parameter that matches the lattice parameter of the III-V material based device channel layer, and wherein the first III-V material based buffer layer has a lattice parameter between the lattice parameter of the silicon substrate and the III-V material based device layer, as described herein.

An integrated circuit die of at least some components of the computing device 1600 (e.g., processor 1601, graphic CPU 1612) include one or more III-V materials based devices, such as tri-gate transistors, nanowires, nanoribbons manufactured using methods as described herein. The term "processor" may refer to any device or portion of a device that processes electronic data from registers and/or memory to transform that electronic data into other electronic data that may be stored in registers and/or memory.

The communication chip 1604 also can include a multilayer stack comprising a first III-V material based buffer layer in a trench in an insulating layer on a silicon substrate, a second III-V material based buffer layer on the first III-V material based buffer layer; and a III-V material based device layer on the second buffer layer, wherein the second III-V material based buffer layer has a lattice parameter that matches the lattice parameter of the III-V material based device channel layer, and wherein the first III-V material based buffer layer has a lattice parameter between the lattice parameter of the silicon substrate and the III-V material based device layer, according to the embodiments described herein.

In further implementations, another component housed within the computing device 1600 may contain a multilayer stack comprising a first III-V material based buffer layer in a trench in an insulating layer on a silicon substrate, a second III-V material based buffer layer on the first III-V material based buffer layer; and a III-V material based device layer on the second buffer layer, wherein the second III-V material based buffer layer has a lattice parameter that matches the lattice parameter of the III-V material based device channel layer, and wherein the first III-V material based buffer layer has a lattice parameter between the lattice parameter of the silicon substrate and the III-V material based device layer according to embodiments described herein.

In accordance with one implementation, the integrated circuit die of the communication chip includes one or more devices, such as tri-gate transistors, nanowire, and nanoribbon devices, as described herein. In various implementations, the computing device 1600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1600 may be any other electronic device that processes data.

The following examples pertain to further embodiments:

A method to manufacture a III-V material based device comprising depositing a first III-V material based buffer layer on a silicon substrate; depositing a second III-V material based buffer layer onto the first III-V material based buffer layer; and depositing a III-V material based device channel layer on the second III-V material based buffer layer.

A method to manufacture a III-V material based device comprising depositing a first III-V material based buffer layer on a silicon substrate; depositing a second III-V material based buffer layer onto the first III-V material based buffer layer; and depositing a III-V material based device channel layer on the second III-V material based buffer layer, wherein the second III-V material based buffer layer has a lattice parameter that matches the lattice parameter of the III-V material based device channel layer.

A method to manufacture a III-V material based device comprising depositing a first III-V material based buffer layer on a silicon substrate; depositing a second III-V material based buffer layer onto the first III-V material based buffer layer; and depositing a III-V material based device channel layer on the second III-V material based buffer layer, wherein the first III-V material based buffer layer has a lattice parameter between the lattice parameter of the silicon substrate and the III-V material based device channel layer.

A method to manufacture a III-V material based device comprising depositing a first III-V material based buffer layer on a silicon substrate; depositing a second III-V material based buffer layer onto the first III-V material based buffer layer; and depositing a III-V material based device channel layer on the second III-V material based buffer layer and depositing a cap layer on the III-V material based device channel layer.

A method to manufacture a III-V material based device comprising forming a trench in an insulating layer on a silicon substrate depositing a first III-V material based buffer layer into the trench on the silicon substrate; depositing a second III-V material based buffer layer onto the first III-V material based buffer layer; and depositing a III-V material based device channel layer on the second III-V material based buffer layer.

A method to manufacture a III-V material based device comprising depositing a first III-V material based buffer layer into a trench in an insulating layer on the silicon substrate; depositing a second III-V material based buffer layer onto the first III-V material based buffer layer; depositing a III-V material based device channel layer on the second III-V material based buffer layer; and depositing a gate dielectric layer over the III-V material based device channel layer.

A method to manufacture a III-V material based device comprising depositing a first III-V material based buffer layer into a trench in an insulating layer on the silicon substrate; depositing a second III-V material based buffer layer onto the first III-V material based buffer layer; depositing a III-V material based device channel layer on the second III-V material based buffer layer; forming a fin comprising the III-V material based device channel layer on the second III-V material based buffer layer on a portion of the first III-V material based buffer layer; and depositing a gate dielectric layer on the fin.

A method to manufacture a III-V material based device comprising depositing a first III-V material based buffer layer into a trench in an insulating layer on the silicon substrate; depositing a second III-V material based buffer layer onto the first III-V material based buffer layer; depositing a III-V material based device channel layer on the second III-V material based buffer layer, and depositing a doped III-V material based layer over the III-V material based device channel layer.

A method to manufacture a III-V material based device comprising depositing a first III-V material based buffer layer into a trench in an insulating layer on the silicon substrate; depositing a second III-V material based buffer layer onto the first III-V material based buffer layer; depositing a III-V material based device channel layer on the second III-V material based buffer layer, wherein concentration of indium in the III-V material based device channel layer is at least 53%.

A method to manufacture a III-V material based device comprising depositing a first III-V material based buffer layer into a trench in an insulating layer on the silicon substrate; depositing a second III-V material based buffer layer onto the first III-V material based buffer layer; depositing a III-V material based device channel layer on the second III-V material based buffer layer, wherein at least one of the first III-V material based buffer layer; the second III-V material based buffer layer, and the III-V material based device channel layer is deposited by a chemical vapor deposition.

A III-V material based device, comprising: a first III-V material based buffer layer on a silicon substrate; a second III-V material based buffer layer on the first III-V material based buffer layer; and a III-V material based device channel layer on the second III-V material based buffer layer.

A III-V material based device, comprising: a first III-V material based buffer layer on a silicon substrate; a second III-V material based buffer layer on the first III-V material based buffer layer; and a III-V material based device channel layer on the second III-V material based buffer layer, wherein the second III-V material based buffer layer has a lattice parameter that matches the lattice parameter of the III-V material based device channel layer.

A III-V material based device, comprising: a first III-V material based buffer layer on a silicon substrate; a second III-V material based buffer layer on the first III-V material based buffer layer; and a III-V material based device channel layer on the second III-V material based buffer layer, wherein the first III-V material based buffer layer has a lattice parameter between the lattice parameter of the silicon substrate and the III-V material based device channel layer.

A III-V material based device, comprising: a first III-V material based buffer layer on a silicon substrate; a second III-V material based buffer layer on the first III-V material based buffer layer; and a III-V material based device channel layer on the second III-V material based buffer layer, wherein at least one of the first III-V material based buffer layer; the second III-V material based buffer layer, and the III-V material based device channel layer is deposited by a chemical vapor deposition.

A III-V material based device, comprising: a first III-V material based buffer layer on a silicon substrate; a second III-V material based buffer layer on the first III-V material based buffer layer; and a III-V material based device channel layer on the second III-V material based buffer layer, wherein a cap layer is deposited on the III-V material based device channel layer.

A III-V material based device, comprising: a trench in an insulating layer on the substrate; a first III-V material based buffer layer in the trench on the silicon substrate; a second III-V material based buffer layer on the first III-V material based buffer layer; and a III-V material based device channel layer on the second III-V material based buffer layer.

A III-V material based device, comprising: a first III-V material based buffer layer on a silicon substrate; a second III-V material based buffer layer on the first III-V material based buffer layer; and a III-V material based device channel layer on the second III-V material based buffer layer; and a gate dielectric layer over the III-V material based device channel layer.

A III-V material based device, comprising: a first III-V material based buffer layer on a silicon substrate; a second III-V material based buffer layer on the first III-V material based buffer layer; and a III-V material based device channel layer on the second III-V material based buffer layer, wherein a fin is formed from the III-V material based device channel layer, the second III-V material based buffer layer; and the first III-V material based buffer layer.

A III-V material based device, comprising: a first III-V material based buffer layer on a silicon substrate; a second III-V material based buffer layer on the first III-V material based buffer layer; and a III-V material based device channel layer on the second III-V material based buffer layer; and a doped III-V material based layer over a portion of the III-V material based device channel layer.

A III-V material based device, comprising: a first III-V material based buffer layer on a silicon substrate; a second III-V material based buffer layer on the first III-V material based buffer layer; and a III-V material based device channel layer on the second III-V material based buffer layer, wherein concentration of indium in the III-V material based device channel layer is at least 53%.

A method to manufacture an electronic device comprising depositing a first buffer layer into a trench in an insulating layer on a substrate; depositing a second buffer layer onto the first buffer layer; and depositing a device layer on the second buffer layer, wherein the second buffer layer has a lattice parameter that matches the lattice parameter of the device channel layer.

A method to manufacture an electronic device comprising depositing a first buffer layer into a trench in an insulating layer on a substrate; depositing a second buffer layer onto the first buffer layer; and depositing a device layer on the second buffer layer, wherein the second buffer layer has a lattice parameter that matches the lattice parameter of the device channel layer, and wherein the first buffer layer has a lattice parameter between the lattice parameter of the substrate and the device layer.

A method to manufacture an electronic device comprising depositing a first buffer layer into a trench in an insulating layer on a substrate; depositing a second buffer layer onto the first buffer layer; and depositing a device layer on the second buffer layer, wherein the second buffer layer has a lattice parameter that matches the lattice parameter of the device channel layer, wherein the first buffer layer has a lattice parameter between the lattice parameter of the substrate and the device layer, and wherein at least one of the first buffer layer, second buffer layer, and device layer is a III-V material based layer, and the substrate is a silicon substrate.

A method to manufacture an electronic device comprising depositing a first buffer layer into a trench in an insulating layer on a substrate; depositing a second buffer layer onto the first buffer layer; and depositing a device layer on the second buffer layer, wherein the second buffer layer has a lattice parameter that matches the lattice parameter of the device channel layer, and wherein the first buffer layer has a lattice parameter between the lattice parameter of the substrate and the device layer, wherein at least one of the first buffer layer, second buffer layer, and device layer is a III-V material based layer, and the substrate is a silicon substrate.

A method to manufacture an electronic device comprising depositing a first buffer layer into a trench in an insulating layer on a substrate; depositing a second buffer layer onto the first buffer layer; and depositing a device layer on the second buffer layer, wherein the second buffer layer has a lattice parameter that matches the lattice parameter of the device channel layer, and wherein the first buffer layer has a lattice parameter between the lattice parameter of the substrate and the device layer, and wherein a cap layer is deposited on the device layer.

An electronic device comprising a first buffer layer in a trench in an insulating layer on a substrate, a second buffer layer on the first buffer layer; and a device layer on the second buffer layer, wherein the second buffer layer has a lattice parameter that matches the lattice parameter of the device channel layer, and wherein the first buffer layer has a lattice parameter between the lattice parameter of the substrate and the device layer.

An electronic device comprising a first buffer layer in a trench in an insulating layer on a substrate, a second buffer layer on the first buffer layer; and a device layer on the second buffer layer, wherein the second buffer layer has a lattice parameter that matches the lattice parameter of the device channel layer, and wherein the first buffer layer has a lattice parameter between the lattice parameter of the substrate and the device layer, and wherein at least one of the first buffer layer, second buffer layer, and device layer is a material based layer, and the substrate is a silicon substrate.

An electronic device comprising a first buffer layer in a trench in an insulating layer on a substrate, a second buffer layer on the first buffer layer; and a device layer on the second buffer layer, wherein the second buffer layer has a lattice parameter that matches the lattice parameter of the device channel layer, and wherein the first buffer layer has a lattice parameter between the lattice parameter of the substrate and the device layer, and wherein a cap layer is deposited on the device layer.

What is claimed is:

1. An integrated circuit structure, comprising:
    a substrate comprising monocrystalline silicon;
    an insulating layer on the substrate, the insulating layer comprising silicon and oxygen, and the insulating layer having a trench therein exposing a monocrystalline silicon surface of the substrate;
    a first buffer layer in the trench and on the monocrystalline silicon surface of the substrate, the first buffer layer comprising indium and phosphorous;
    a second buffer layer in the trench and on the first buffer layer, the second buffer layer comprising indium, gallium, arsenic and antimony; and
    a device channel layer on the second buffer layer, the device layer comprising indium, gallium, and arsenic, the device channel layer having a top and sidewalls.

2. The integrated circuit structure of claim 1, further comprising a gate dielectric layer and a gate electrode on the top and sidewalls of the device channel layer.

3. The integrated circuit structure of claim 2, further comprising:
    a first source or drain region at a first side of the gate electrode; and
    a second source or drain region at a second side of the gate electrode, the second side opposite the first side.

4. The integrated circuit structure of claim 2, wherein the gate dielectric layer comprises hafnium and oxygen.

5. The integrated circuit structure of claim 2, wherein the gate dielectric layer comprises silicon and oxygen.

6. The integrated circuit structure of claim 1, wherein the device channel layer is a transistor channel layer.

7. The integrated circuit structure of claim 1, wherein the second buffer layer extends above the insulating layer.

8. The integrated circuit structure of claim 1, wherein the device channel layer has concentration of indium of at least 53%.

9. The integrated circuit structure of claim 1, wherein the device channel layer comprises $In_{0.7}Ga_{0.3}As$.

10. The integrated circuit structure of claim 1, further comprising:
    a cap layer on the device channel layer.

11. The integrated circuit structure of claim 9, wherein the cap layer comprises indium and phosphorus.

12. A computing device, comprising:
    a board; and
    a component coupled to the board, the component including an integrated circuit structure, comprising:
        a substrate comprising monocrystalline silicon;
        an insulating layer on the substrate, the insulating layer comprising silicon and oxygen, and the insulating layer having a trench therein exposing a monocrystalline silicon surface of the substrate;
        a first buffer layer in the trench and on the monocrystalline silicon surface of the substrate, the first buffer layer comprising indium and phosphorous;
        a second buffer layer in the trench and on the first buffer layer, the second buffer layer comprising indium, gallium, arsenic and antimony; and
        a device channel layer on the second buffer layer, the device layer comprising indium, gallium, and arsenic, the device channel layer having a top and sidewalls.

13. The computing device of claim 12, further comprising:
    a memory coupled to the board.

14. The computing device of claim 12, further comprising:
    a communication chip coupled to the board.

15. The computing device of claim 12, further comprising:
    a camera coupled to the board.

16. The computing device of claim 12, further comprising:
    a battery coupled to the board.

17. The computing device of claim 12, further comprising:
    an antenna coupled to the board.

18. The computing device of claim 12, wherein the component is a packaged integrated circuit die.

19. The computing device of claim 12, wherein the component is selected from the group consisting of a processor, a communications chip, and a digital signal processor.

20. The computing device of claim 12, wherein the computing device is selected from the group consisting of a mobile phone, a laptop, a desk top computer, a server, and a set-top box.

* * * * *